United States Patent
Nishi et al.

[11] Patent Number: 5,635,329
[45] Date of Patent: Jun. 3, 1997

[54] PHOTOSENSITIVE RESIN COMPOSITION AND METHOD FOR FORMING A PATTERN USING THE COMPOSITION

[75] Inventors: Mineo Nishi; Koji Nakano; Makoto Ikemoto, all of Kitakyushu, Japan

[73] Assignee: Mitsubishi Chemical Corporation, Tokyo, Japan

[21] Appl. No.: 359,822

[22] Filed: Dec. 20, 1994

[30] Foreign Application Priority Data

Dec. 20, 1993 [JP] Japan .................. 5-319756

[51] Int. Cl.$^6$ .................. G03F 7/023
[52] U.S. Cl. .................. 430/192; 430/165; 430/190; 430/193; 430/326
[58] Field of Search .................. 430/165, 192, 430/193, 190, 326

[56] References Cited

U.S. PATENT DOCUMENTS

| | | | |
|---|---|---|---|
| 5,188,921 | 2/1993 | Jeffries, III et al. | 430/192 |
| 5,196,289 | 3/1993 | Jeffries, III et al. | 430/192 |
| 5,279,918 | 1/1994 | Nishi et al. | 430/190 |
| 5,326,665 | 7/1994 | Osaki et al. | 430/192 |
| 5,372,909 | 12/1994 | Nishi et al. | 430/192 |
| 5,468,590 | 11/1995 | Hashimoto et al. | 430/191 |

FOREIGN PATENT DOCUMENTS

| | | |
|---|---|---|
| 0336604 | 10/1989 | European Pat. Off. . |
| 4231875 | 3/1993 | Germany . |

*Primary Examiner*—John S. Chu
*Attorney, Agent, or Firm*—Oblon, Spivak, McClelland, Maier & Neustadt, P.C.

[57] ABSTRACT

A photosensitive resin composition comprising an alkali-soluble resin, a quinonediazide-type photosensitive compound and a solvent, wherein the alkali-soluble resin is a polycondensation product of ① at least one phenolic compound (A) of the following formula (A) with ② formaldehyde (a) and at least one carbonyl compound (b) of the following formula (B), in which the mixing ratio of the formaldehyde (a) to the carbonyl compound (b) is within a range of from 1/99 to 99/1 in terms of the molar ratio of (a)/(b), and the alkaline soluble resin has partial structures of the following formula (C), in which the weight ratio of repeating units (β) wherein m is from 1 to 5, to repeating units (α) wherein m is 0, i.e. the weight ratio of (β)/(α), is at most 0.25:

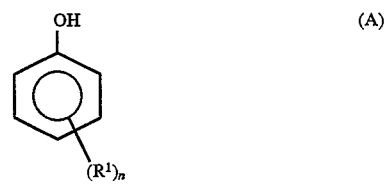

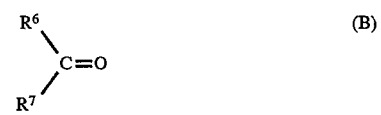

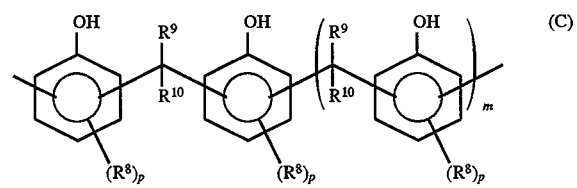

wherein $R^1$ is a group of the formula $R^2$, $OR^3$, $COOR^4$ or $CH_2COOR^5$, wherein $R^2$ is a $C_{1-4}$ alkyl group, each of $R^3$, $R^4$ and $R^5$ which are independent of one another, is a hydrogen atom or a $C_{1-4}$ alkyl group, n is an integer of from 0 to 3, provided that when n is 2 or 3, a plurality of $R^1$ may be the same or different, each of $R^6$ and $R^7$ which are independent of each other, is a hydrogen atom, a $C_{1-4}$ lower alkyl group, an aryl group or an aralkyl group, $R^8$ is the same group as $R^1$, $R^9$ is the same group as $R^6$, $R^{10}$ is the same group as $R^7$, p is the same integer as n, provided that $R^6$ and $R^7$, and $R^9$ and $R^{10}$, are not simultaneously hydrogen atoms, and m is an integer of from 0 to 5.

17 Claims, No Drawings

PHOTOSENSITIVE RESIN COMPOSITION AND METHOD FOR FORMING A PATTERN USING THE COMPOSITION

The present invention relates to a photosensitive resin composition which is sensitive to radiation such as ultraviolet rays, far ultraviolet rays, electron beams or X-rays. Particularly, the present invention relates to an improvement in a photosensitive resin composition comprising an alkali-soluble resin, a quinonediazide-type photosensitive compound and a solvent.

Heretofore, a photoresist is known which comprises an alkali-soluble novolak resin and a quinonediazide-type photosensitive compound which is capable of functioning as an alkali dissolution inhibitor. With such a photoresist, when irradiated, the quinonediazide-type photosensitive compound (hereinafter referred to simply as a photosensitive material) decomposes to carbene and then to a ketene, which reacts with a moisture within and outside the system to form indenecarboxylic acid, which is readily soluble in an aqueous alkaline solution. On the other hand, at a non-irradiated portion, the photosensitive material hinders the solubility of the alkali-soluble novolak resin in the alkali developer (hereinafter such a hindering effect is referred to as a masking effect), whereby the non-irradiated portion is hardly soluble in an alkali developer, undergoes no substantial swelling and maintains a high film-remaining ratio. As a result, a resist pattern with a high resolution, can be obtained.

In recent years, high densification of semiconductor integrated circuits has progressed, and requirements for the production process have been increasingly severe. Accordingly, requirements for a photoresist have also been increasingly high. In particular, high sensitivity, high resolution, high rectangularity of the pattern profile, high dry etching resistance, high heat resistance and a wide exposure margin are strongly desired. In order to fulfill such severe requirements, various improvements have been attempted with respect to photoresist materials, and detailed studies have been made on a wide range of materials including resins, photosensitive materials, developers and additives.

It has been found that a photosensitive resin composition employing, as an alkali-soluble resin, a certain specific novolak resin i.e. a polycondensation product of at least one phenol compound with formaldehyde and a certain specific carbonyl compound, has high resolution and excellent exposure margin, as compared with a conventional product i.e. a photosensitive resin composition employing, as an alkali-soluble resin, a polycondensation product of a phenol compound with formaldehyde (Japanese Unexamined Patent Publication No. 253012/1992). In recent years, higher sensitivity is desired for the resist in order to further improve the productivity. In this respect, even such a photosensitive resin composition is not yet fully satisfactory.

Heretofore, if the molecular weight of the alkali-soluble resin is lowered, or the amount of the photosensitive agent is decreased to obtain higher sensitivity, no adequate masking effects have been obtained, and deterioration in the pattern profile, resolution and exposure margin has been substantial, although the sensitivity of the photoresist can thereby be improved. Thus, by the conventional technique, it has been difficult to develop a resist satisfying the requirements for both the high sensitivity and the high performance.

Under these circumstances, it is an object of the present invention to provide a photoresist composition which is superior in the pattern profile and developing properties to the conventional product and which at the same time has high resolution, excellent exposure margin and high sensitivity.

The present inventors have conducted extensive researches to solve the above-mentioned problems and as a result, have found that a photosensitive resin composition employing, as an alkali-soluble resin, a certain specific novolak resin, i.e. a photosensitive resin composition employing a novolak resin which is a polycondensation product of at least one phenolic compound with formaldehyde and a certain specific carbonyl compound, wherein among partial structures formed by a condensation product of the phenolic compound with the specific carbonyl compound, the proportion of a dimer moiety is within a specific range, has high resolution, excellent exposure margin and high sensitivity, as compared with the conventional product i.e. a photosensitive resin composition employing, as an alkali-soluble resin, a polycondensation product of a phenolic compound with formaldehyde. The present invention has been accomplished on the basis of this discovery.

Namely, the present invention provides a photosensitive resin composition comprising an alkali-soluble resin, a quinonediazide-type photosensitive compound and a solvent, wherein the alkali-soluble resin is a polycondensation product of ① at least one phenolic compound (A) of the following formula (A) with ② formaldehyde (a) and at least one carbonyl compound (b) of the following formula (B), in which the mixing ratio of the formaldehyde (a) to the carbonyl compound (b) is within a range of from 1/99 to 99/1 in terms of the molar ratio of (a)/(b), and the alkaline soluble resin has partial structures of the following formula (C), in which the weight ratio of repeating units (β) wherein m is from 1 to 5, to repeating units (α) wherein m is 0, i.e. the weight ratio of (β)/(α), is at most 0.25:

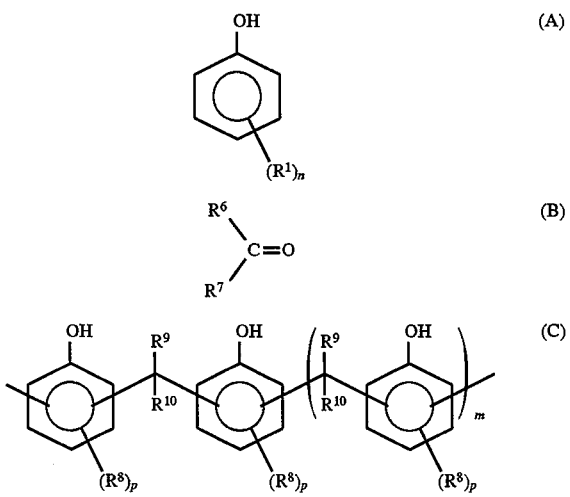

wherein $R^1$ is a group of the formula $R^2$, $OR^3$, $COOR^4$ or $CH_2COOR^5$, wherein $R^2$ is a $C_{1-4}$ alkyl group, each of $R^3$, $R^4$ and $R^5$ which are independent of one another, is a hydrogen atom or a $C_{1-4}$ alkyl group, n is an integer of from 0 to 3, provided that when n is 2 or 3, a plurality of $R^1$ may be the same or different, each of $R^6$ and $R^7$ which are independent of each other, is a hydrogen atom, a $C_{1-4}$ lower alkyl group, an aryl group or an aralkyl group, $R^8$ is the same group as $R^1$, $R^9$ is the same group as $R^6$, $R^{10}$ is the same group as $R^7$, p is the same integer as n, provided that $R^6$ and $R^7$, and $R^9$ and $R^{10}$, are not simultaneously hydrogen atoms, and m is an integer of from 0 to 5.

The present invention also provides a photosensitive resin composition comprising an alkali-soluble resin, a quinonediazide-type photosensitive compound and a solvent, wherein the alkali-soluble resin is a polycondensation product of ① at least one phenolic compound (A) of the following formula (A) and ② a mixture (D) of phenolic compounds of the following formula (D), in which the weight ratio of compounds (D-2) wherein r is from 1 to 5, to compounds (D-1) wherein r is 0, i.e. the weight ratio of (D-2)/(D-1), is at most 0.25, with formaldehyde (a):

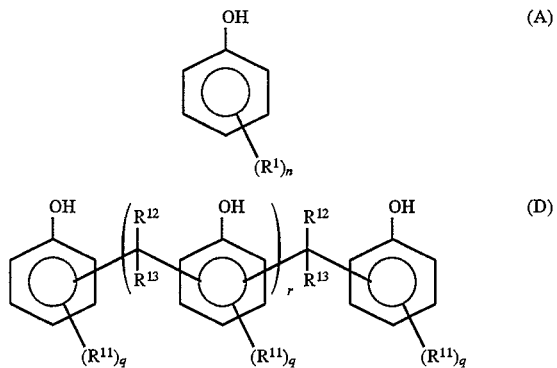

wherein $R^1$ is a group of the formula $R^2$, $OR^3$, $COOR^4$ or $CH_2COOR^5$, wherein $R^2$ is a $C_{1-4}$ alkyl group, each of $R^3$, $R^4$ and $R^5$ which are independent of one another, is a hydrogen atom or a $C_{1-4}$ alkyl group, n is an integer of from 0 to 3, provided that when n is 2 or 3, a plurality of $R^1$ may be the same or different, $R^{11}$ is the same group as $R^1$, each of $R^{12}$ and $R^{13}$ which are independent of each other, is a hydrogen atom, a $C_{1-4}$ lower alkyl group, an aryl group or an aralkyl group, q is the same integer as n, provided that $R^{12}$ and $R^{13}$ are not simultaneously hydrogen atoms, and r is an integer of from 0 to 5.

Further, the present invention provides a method for forming a resist pattern on a substrate for a semiconductor, which comprises coating such a photosensitive resin composition on the substrate, subjecting it to exposure to copy a pattern and then developing it to form the resist pattern.

Now, the present invention will be described in detail with reference to the preferred embodiments.

The photosensitive resin composition of the present invention is characterized by using a specific novolak resin as the alkali-soluble resin. The phenolic compound used as a component of such a novolak resin is represented by the above formula (A). Such phenolic compounds may be used alone or in combination as a mixture. In the formula (A), $R^1$ is a group represented by $R^2$, $OR^3$, $COOR^4$ or $CH_2COOR^5$, wherein $R^2$ is a $C_{1-4}$ alkyl group, and each of $R^3$, $R^4$ and $R^5$ which are independent of one another, is a hydrogen atom or a $C_{1-4}$ alkyl group. The $C_{1-4}$ alkyl group for $R^2$, $R^3$, $R^4$ and $R^5$, may, for example, be a methyl group, an ethyl group, a n-propyl group, an i-propyl group or a n-butyl group. In the formula (A), n is an integer of from 0 to 3, provided that when n is 2 or 3, the plurality of $R^1$ may be the same or different.

The compound of the above formula (A) includes, for example, phenol, o-cresol, m-cresol, p-cresol, 2-ethylphenol, 3-ethylphenol, 4-ethylphenol, 2-isopropylphenol, 3-isopropylphenol, 4-isopropylphenol, 2-propylphenol, 3-propylphenol, 4-propylphenol, 2-t-butylphenol, 3-t-butylphenol, 4-t-butylphenol, 3,5-xylenol, 2,5-xylenol, 2,3-xylenol, 3,4-xylenol, 2,3-diethylphenol, 2,5-diethylphenol, 3,4-diethylphenol, 3,5-diethylphenol, 2-t-butyl-5-methylphenol, 2,3,5-trimethylphenol, 3,4,5-trimethylphenol, resorcinol, 2-methylresorcinol, 4-methylresorcinol, 5-methylresorcinol, catechol, 4-t-butylcatechol, pyrogallol, 2-methoxyphenol, 3-methoxyphenol, 4-methoxyphenol, 2-methoxyresorcinol, 2,3-dimethoxyphenol, 2,5-dimethoxyphenol, 3,5-dimethoxyphenol, 2-methoxy-5-methylphenol, gallic acid, methyl gallate, ethyl gallate, methyl 3-methoxy-4,5-dihydroxybenzoate, ethyl 3-methoxy-4,5-dihydroxybenzoate, methyl 4-methoxy-3,5-dihydroxybenzoate, ethyl 4-methoxy-3,5-dihyroxybenzoate, 3,4-dimethoxy-5-hydroxybenzoic acid, methyl 3,5-dimethoxy-4-hydroxybenzoate, ethyl 3,5-dimethoxy-4-hydroxybenzoate and 4-hydroxyphenylacetic acid.

It is preferred that in the above formula (A), $R^1$ is $R^2$, $OR^3$ or $CH_2COOR^5$, wherein each of $R^3$ and $R^5$ which are independent of each other, is a hydrogen atom or a $C_{1-4}$ alkyl group. Specifically, preferred as the compound of the formula (A) are o-cresol, m-cresol, p-cresol, 3,5-xylenol, 2,5-xylenol, 2,3-xylenol, 3,4-xylenol, 2,3,5-trimethylphenol, 3,4,5-trimethylphenol, resorcinol, 2-methylresorcinol, pyrogallol and 4-hydroxyphenylacetic acid.

Particularly preferred is a compound of the formula (A) wherein $R^1$ is $R^2$ or $OR^3$, wherein $R^2$ is a $C_{1-2}$ alkyl group, $R^3$ is a hydrogen atom, and n is an integer of 1 or 2.

When the carbon number of $R^2$ is 3 or more, there will be a deterioration in the heat resistance or the sensitivity. When $R^3$ is other than a hydrogen atom, the sensitivity tends to deteriorate.

Among the compounds of the formula (A), m-cresol, p-cresol, 2,5-xylenol, 3,5-xylenol, resorcinol and 2-methylresorcinol are particularly preferred. They may be used alone or in admixture. Preferred mixing ratios (molar ratios) of such compounds may, for example, be (1) m-cresol:p-cresol=4-9:1-6, (2) m-cresol:p-cresol:2,5-xylenol=1-7:1-7:0.1-7, (3) m-cresol:p-cresol:3,5-xylenol=1-7:1-7:0.1-7, (4) m-cresol:p-cresol:resorcinol:2-methylresorcinol=1-7:1-7:0-2:0-2, (5) m-cresol:p-cresol:2,5-xylenol:resorcinol:2-methylresorcinol= 1-7:1-7:0.1-7:0-2:0-2, (6) m-cresol:p-cresol:3,5-xylenol:resorcinol:2-methylresorcinol=1-7:1-7:0.1-7:0-2:0-2. However, in the above (4), (5) and (6), at least one of resorcinol and 2-methylresorcinol is not 0. In the present invention, a novolak resin which is an alkali-soluble novolak resin obtained by polycondensation of such a phenolic compound with formaldehyde and a carbonyl compound of the formula (B) as described hereinafter and which satisfies the aftermentioned requirements for the constituting elements, is used as an alkali-soluble resin for the photosensitive resin composition. Particularly when an attention is drawn to the phenolic compounds of the formula (A), the combinations of the above (1), (2) and (3) tend to improve resolution, and the improvement is particularly remarkable with the combination of (2). Further, with the combinations of the above (4), (5) and (6), improvement in the heat resistance is remarkable in addition to improvement in the resolution.

On the other hand, as other components of the novolak resin, formaldehyde (a) and at least one carbonyl compound (b) of the formula (B) are employed. In the formula (B), each of $R^6$ and $R^7$ which are independent of each other, is a hydrogen atom, a $C_{1-4}$ lower alkyl group, an aryl group or an aralkyl group, provided that $R^6$ and $R^7$ are not simultaneously hydrogen atoms. The $C_{1-4}$ lower alkyl group for $R^6$ and $R^7$ may, for example, be a methyl group, an ethyl group, a n-propyl group, an i-propyl group and a n-butyl group; the aryl group may, for example, be a phenyl group; and the aralkyl group may, for example, be a benzyl group. Among the carbonyl compounds of the above formula (B), the aldehyde may, for example, be an aliphatic aldehyde such as acetaldehyde, propionaldehyde or butylaldehyde, and an aromatic aldehyde such as benzaldehyde or phenylacetaldehyde. The ketone may, for example, be an aliphatic ketone such as acetone or ethyl methyl ketone, or an aromatic ketone such as acetophenone or benzophenone. These carbonyl compounds may be used alone or in combination as a mixture of them in optional proportions. As a source of the carbonyl compound of the formula (B) as a component constituting the alkali-soluble resin, any material may be used so long as it is capable of being converted to the carbonyl compound of the formula (B) in the reaction system for the preparation of the alkali-soluble resin. Accordingly, the compound to be added to the reaction system includes para-aldehydes. Among these compounds, an aliphatic aldehyde having a total carbon number of from 2 to 4, benzaldehyde and aceton, and those convertible to such compounds are preferred. Among the compounds of the formula (B), those wherein $R^6$ is a methyl group or an ethyl group, and $R^7$ is a hydrogen atom, i.e. acetaldehyde and propionaldehyde, are particularly preferred. As the material convertible to the compound of the formula (B) in the reaction system, para-aldehyde is preferred. Acetaldehyde and para-aldehyde are especially preferred, since photosensitive resin compositions containing them as carbonyl components of the novolak resins, have a practically high sensitivity, and it is thereby possible to attain a wide exposure margin. When the compound of the formula (B) is an aliphatic aldehyde, if the total carbon number is 5 or more, the sensitivity of the photosensitive resin composition containing it as the carbonyl component of the novolak resin, tends to be poor, and such is undesirable.

In the present invention, formaldehyde (a) and the above carbonyl compound (b) of the formula (B) are used in combination as components of the novolak resin, as mentioned above. With respect to the mixing ratio of formaldehyde (a) to the carbonyl compound (b) of the formula (B), the molar ratio of (a)/(b) is within a range of from 1/99 to 99/1, preferably from 50/50 to 95/5, more preferably from 70/30 to 90/10, most preferably from 75/25 to 85/15.

If the proportion of the carbonyl compound of the formula (B) to the formaldehyde is too small, improvement in the resolution and exposure margin by the photosensitive resin composition containing such a novolak resin, tends to be small. On the other hand, if the proportion of the carbonyl group of the formula (B) to the formaldehyde is too much, the sensitivity of the photosensitive resin composition containing such a novolak resin, tends to be poor. In the above definition of the mixing ratio, the proportion of (b) indicates the total amount of carbonyl compounds (b) of the formula (B).

Further, in the present invention, among partial structures of the above formula (C) in the novolak resin, the weight ratio of repeating units (β) wherein m is from 1 to 5, to repeating units (α) wherein m is 0, i.e. the weight ratio of (β)/(α), is required to be at most 0.25, preferably from 0.01 to 0.20, more preferably from 0.08 to 0.20. Further, as the repeating units (β), it is preferred that they are mainly composed of repeating units wherein m is 1, i.e. repeating units wherein m is 1 constitute at least 50%.

In the formula (C), $R^8$ is the same group as $R^1$, $R^9$ is the same group as $R^6$, $R^{10}$ is the same group as $R^7$, and p is the same integer as n. Preferably, $R^8$ and $R^1$, $R^9$ and $R^6$, and $R^{10}$ and $R^7$, are identical groups, respectively, and p and n are identical integers.

As a method for producing the above-mentioned novolak resin of the present invention, a method may be mentioned wherein the molar ratio of the carbonyl compound of the formula (B) and formaldehyde to the phenolic compound of the formula (A) is properly selected to obtain a novolak resin having a desired molecular weight. The ratio of the total amount of the formaldehyde (a) and the carbonyl compound (b) to the phenolic compound of the formula (A) is not particularly limited, but is preferably at a level of from 0.72 to 0.82, more preferably from 0.73 to 0.80. The novolak resin of the present invention is usually prepared in accordance with a conventional method by e.g. a method wherein the phenolic compound of the formula (A) is mixed and heated with formaldehyde and the carbonyl compound of the formula (B) in the presence of e.g. an acid catalyst for polycondensation. As the acid catalyst, an inorganic acid such as hydrochloric acid, nitric acid or sulfuric acid, or an organic acid such as formic acid, oxalic acid or acetic acid, may be employed. These acids may be used alone or in combination as a mixture. In the polycondensation reaction of the present invention, a solvent for the reaction may not usually be required, but a solvent may be used. As such a solvent, an alcohol such as methanol, ethanol or propanol, or an ether such as ethylene glycol dimethyl ether or diethylene glycol dimethyl ether, may, for example, be mentioned. The reaction temperature varies depending upon the phenolic compound of the formula (A) used as a starting material, but is usually within a range of from 70° to 150° C., preferably from 80° to 110° C. After completion of the reaction, it is common to increase the internal temperature to a level of from 150° to 250° C. to distill off unreacted materials, the acid catalyst and water under reduced pressure, followed by withdrawing a molten novolak resin to obtain the desired novolak resin. In a case where a solvent for the reaction is employed, it is possible that after completion of the reaction, the reaction mixture is added to a solvent such as water to precipitate the novolak resin, and the precipitate is collected by filtration and dried to obtain the desired novolak resin. In the present invention, it is also possible to employ a method wherein at least one phenolic compound (A) of the formula (A) is reacted with at least one carbonyl compound of the formula (B) to obtain a mixture (D) of phenolic compounds of the formula (D), and then the mixture is further polycondensed with at least one phenolic compound (A) of the formula (A) and formaldehyde to obtain an alkali-soluble resin. In such a case, it is required that in the above formula (D), the weight ratio of compounds (D-2) wherein r is from 1 to 5, to compounds (D-1) wherein r is 0, i.e. the weight ratio of (D-2)/(D-1), is at most 0.25. As such a method, a method may be mentioned wherein the reaction of the phenolic compound (A) with the carbonyl compound (B) is carried out by properly adjusting the reaction temperature and the amount of the catalyst to prepare the mixture (D) of phenolic compounds, or a resin obtained by condensing the phenolic compound (A) and the carbonyl compound (b) in accordance with a conventional method, is subjected to extraction of low molecular weight components by a solvent mixture of e.g. water/methanol, to obtain the mixture (D) of phenolic compounds, and the mixture (D) is further polycondensed with the phenolic compound (A) and formaldehyde in accordance with a conventional method. The reaction temperature is usually at a level of from 70° to 150° C., preferably from 80° to 110° C., as in the above case.

The mixing ratio (molar ratio) of the phenolic compound (A) to the mixture (D) of phenolic compounds is usually such that (A)/(D) is from 0.1 to 50, preferably from 0.2 to 20, more preferably from 1 to 15.

In the formula (D), $R^{11}$ is the same group as $R^1$, $R^{12}$ is the same group as $R^6$, $R^{13}$ is the same group as $R^7$, and q is the same integer as n. Preferably, $R^8$ and $R^1$, $R^9$ and $R^6$, and $R^{10}$ and $R^7$, are identical groups, respectively, and q and n are identical integers. In the present invention, the above-mentioned novolak resins may be used alone or in combination as a mixture of two or more of them, as the alkali-soluble resin. The weight average molecular weight (hereinafter referred to as Mw) of the alkali-soluble resin of the present invention, as calculated as polystyrene, is usually preferably from 2,500 to 7,000. If Mw is less than 2,500, the heat resistance of the photosensitive resin composition tends to be poor. On the other hand, if it exceeds 7,000, the sensitivity tends to be poor. A particularly preferred range is from 2,800 to 6,000.

As the quinonediazide-type photosensitive compound to be used in the present invention, an esterification product of a quinonediazide sulfonic acid such as 1,2-benzoquinonediazide-4-sulfonic acid, 1,2-naphthoquinonediazide-4-sulfonic acid or 1,2-naphthoquinonediazide-5-sulfonic acid, is preferred. Particularly preferred is an esterification product of 1,2-naphthoquinoenediazide-4-sulfonic acid, or an esterification product of 1,2-naphthoquinonediazide-5-sulfonic acid. The esterification product of the 4-sulfonic acid is preferred in a case where a light having a wavelength within a range of from 330 to 420 nm is used. Likewise, the esterification product of the 5-sulfonic acid is preferred in a case where light having a wavelength within a range of from 330 to 450 nm is used. Specifically, as the quinonediazide-type photosensitive compound, a 1,2-benzoquinonediazide-4-sulfonic acid ester, a 1,2-naphthoquinoenediazide-4-sulfonic acid ester or a 1,2-naphthoquinonediazide-5-sulfonic acid ester of a compound or resin as identified in the following (a) to (c), is preferably employed.

(a) A polyhydroxy aliphatic compound such as glycerol or pentaerythrytol.

(b) A polyhydroxy aromatic compound such as bisphenol A, a gallic acid, kercetin, morin, polyhydroxybenzophenone or a trisphenol of the following formula (E):

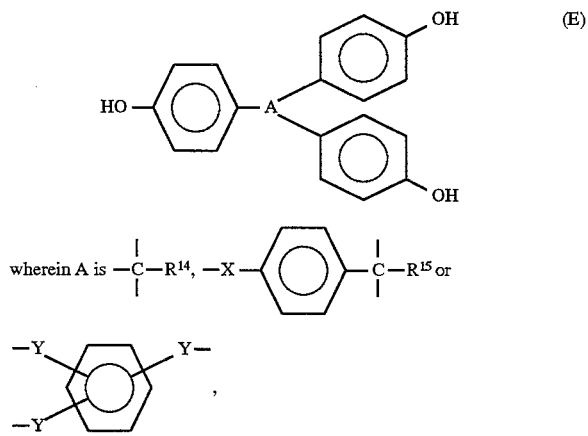

wherein each of $R^{14}$ and $R^{15}$ is a hydrogen atom or a $C_{1-4}$ alkyl group, and each of —X— and —Y— is a $C_{1-4}$ alkylene group.

(c) A phenol resin (hereinafter referred to as a ballast resin) obtained by dehydration condensation of a phenol with an aldehyde and/or ketone.

The esterification ratio, by quinonediazide sulfonic acid, of hydroxyl groups in the compound or resin of the above (a) to (c) in the esterification product of such a quinonediazide sulfonic acid is usually from 30 to 100%, preferably from 40 to 100%.

Among the above-mentioned photosensitive compounds, a quinonediazide sulfonic acid ester of a polyhydroxy aromatic compound or a ballast resin is preferred. Particularly preferred is a quinonediazide sulfonic acid ester of at least one compound selected from the group consisting of polyhydroxybenzophenone, a trisphenol of the above formula (E) and a ballast resin. Especially preferred is a quinonediazide sulfonic acid ester of a polyhydroxybenzophenone and/or a ballast resin.

The polyhydroxybenzophenone may, for example, be 2,3,4-trihydroxybenzophenone, 2,3,4,4'-tetrahydroxybenzophenone, 2,2',4,4'-tetrahydroxybenzophenone, 2,3,4,2',6'-pentohydroxybenzophenone, 2,2',3,4,4'-pentahydroxybenzophenone or 2,3,3',4,4',5'-hexahydroxybenzophenone. Among them, a polyhydroxybenzophenone having from 3 to 6 hydroxyl groups, is preferred. Particularly preferred is a polyhydroxybenzophenone having from 4 to 6 hydroxyl groups.

The ballast resin may, for example, be a resin which is obtained by polycondensing one or more phenolic compounds selected from the group consisting of phenol, alkylphenols such as o-cresol, m-cresol, p-cresol, 3-ethylphenol, p-t-butylphenol, 3,5-dimethylphenol, 2,5-dimethylphenol and 2,3,5-trimethylphenol, arylphenols such as o-hydroxydiphenyl and p-hydroxydiphenyl, resorcinols such as resorcinol, 2-methylresorcinol, 4-methylresorcinol, 5-methylresorcinol, 2-ethylresorcinol and 2,5-dimethylresorcinol, catechols such as catechol, 3-methylcatechol, 4-methylcatechol and 3,5-dimethylcatechol, and pyrogallols such as pyrogallol and 5-methylpyrogallol, with one or more carbonyl compounds selected from the group consisting of aldehydes such as formaldehyde, acetaldehyde, propionaldehyde and benzaldehyde and ketones such as acetone, methyl ethyl ketone, diethyl ketone, acetophenone and benzophenone. The weight average molecular weight of the resin used as the ballast resin is preferably within a range of from 400 to 2,200. If the molecular weight of this ballast resin is small, no adequate masking effect will be obtained, whereby it tends to be difficult to obtain a satisfactory pattern profile. On the other hand, if the molecular weight is large, the sensitivity tends to be poor. The molecular weight of the ballast resin is particularly preferably within a range of from 450 to 1,800. When the ballast resin is a resin obtained by dehydration condensation of m-cresol with formaldehyde and/or acetaldehyde, excellent effects will be obtained particularly with respect to the resolution and the pattern profile.

As a method for producing such a ballast resin, a method may be employed wherein the phenolic compound and the ketone or aldehyde are heated and poly-condensed in the presence of an acid catalyst at a temperature of from 50° to 100° C. in accordance with a conventional method.

In the present invention, the above-described photosensitive compounds may be used alone or in combination as a mixture of two or more of them.

As the solvent incorporated in the photosensitive resin composition of the present invention, any solvent may be used so long as it is capable of dissolving the above quinonediazide-type photosensitive compound and the alkali-soluble resin. Usually, the one having a boiling point of from 100° to 180° C. is preferred from the viewpoint of convenience in the practical use of the photosensitive resin composition. The solvent may, for example, be an ether ester such as ethylcellosolve acetate, methylcellosolve acetate, propylene glycol monomethyl ether acetate or propylene glycol monoethyl ether acetate, an ether alcohol such as ethylcellosolve, methylcellosolve or propylene glycol monomethyl ether, a carboxylic acid ester such as ethyl acetate, butyl acetate or ethyl butyrate, a lactone such as γ-butyrolactone, a ketone such as methyl amyl ketone, methyl isobutyl ketone, ethyl amyl ketone or ethyl butyl ketone, a cyclic ketone such as cyclopentanone or cyclohexanone, a carboxylic acid ester of a dibasic acid such as diethyl oxalate or diethyl malonate, a dicarboxylic acid ester such as ethylene glycol diacetate or propylene glycol diacetate, an oxycarboxylic acid ester such as methyl 2-oxypropionate, ethyl 2-oxypropionate, ethyl 3-oxypropionate, methyl 3-methoxypropionate or ethyl 3-methoxypropionate, methyl 3-ethoxypropionate or ethyl 3-ethoxypropionate, or an ketone ester such as ethyl pyruvate. These solvents may be used alone or in combination as a mixture of two or more of them.

The concentration of the alkali-soluble resin in the photosensitive resin composition of the present invention is usually from 1 to 35% by weight. The concentration of the quinonediazide-type photosensitive compound is usually from 0.1 to 30% by weight. The proportion of the quinonediazide-type photosensitive compound relative to the alkali-soluble resin is usually from 0.1 to 1.5 time by weight.

Further, to the photosensitive resin composition of the present invention, a surfactant such as a polyoxyethylene ether or a fluorinated alkyl ester, may be incorporated to prevent a coating defect such as striation, as the case requires. The amount of such a surfactant is usually not more than 2% by weight, preferably not more than 1% by weight. Further, a dye or the like may be added to minimize the influence of irregularly reflected lights from the substrate at the time of copying an image, and a sensitizer may be added to improve the sensitivity.

The photosensitive resin composition of the present invention is used in accordance with a conventional method through such steps as coating on a substrate, exposure to copy a pattern and development. The substrate on which the photoresist composition is coated, is a semiconductor substrate such as a silicon wafer. Coating of the photosensitive resin composition on such a substrate is conducted usually by means of a spin coater, and the film thickness of the photosensitive resin composition is usually from 0.3 to 5 µm. Usually, after coating the photosensitive resin composition, the substrate is heated on e.g. a hot plate to remove the solvent, and then exposure is conducted through a mask to form a desired pattern on the substrate. For the exposure, a light with a wavelength of from 330 to 450 nm such as g-line (436 nm) or i-line (365 nm), is preferably employed. After the exposure, the substrate is heated at a temperature of from 90° to 120° C. for from 60 to 120 seconds, as the case requires, and then subjected to development with an aqueous alkaline solution. As the aqueous alkaline solution, an aqueous alkaline solution such as an aqueous solution of e.g. an inorganic alkali such as potassium hydroxide, sodium carbonate, sodium silicate, sodium methasilicate or aqueous ammonia, a primary amine such as ethylamine or n-propylamine, a secondary amine such as diethylamine or di-n-propylamine, or a tertiary amine such as triethylamine or trimethylamine, or a quaternary ammonium salt such as tetramethylammonium hydroxide or trimethylhydroxyethylammonium hydroxide, may preferably be employed. Further, an alcohol, a surfactant or the like may be incorporated to the developer, as the case requires.

The photosensitive resin composition of the present invention has a high level of resolution and a large exposure margin and yet has excellent sensitivity by virtue of the specific novolak resin used as the alkali-soluble resin, and it is useful particularly as a photoresist.

Now, the present invention will be described in further detail with reference to Examples. However, it should be understood that the present invention is by no means restricted by such specific Examples. In the following Examples, the molecular weight is a weight average molecular weight as calculated as polystyrene from the results of the analysis by gel permeation chromatography, and the esterification ratio is an esterification ratio obtained from the molar ratio of the charged starting materials. (D)/(A) represents a molar ratio of the mixture (D) of phenolic compounds of the formula (D) to the phenolic compound (A) of the formula (A), obtained from the molar ratio of the charged starting materials. Among the partial structures of the formula (C) in the alkali-soluble resin, the weight ratio of $(\beta)/(\alpha)$ is represented by a value obtained by the chromatogram when in each Novolak Resin Preparation Example, the reaction product prior to the addition of formaldehyde was analyzed by the following apparatus under the following conditions.

Apparatus

Main body: TSK-HLC-802A Model, manufactured by Toyo Soda

Column: G5000HXL+G4000HXL+G3000HXL+G2000HXL Data-treating apparatus and autosampler: CP-8000, manufactured by Toyo Soda Detector: RI (polarized differential refractometer (Price Model), range of refractive index: 1.00–1.80 (From the difference in the refractive index between the solvent and the solvent containing a separated component, the concentration of the component, accordingly its relative content, is determined.)

Conditions

Eluent: THF (First grade reagent, manufactured by Ishizu Seiyaku)

Temperature of eluent: 38° C.

Flow rate of eluent: 0.7 ml

Measurement range: $10^5$–$10^2$ (molecular weight)

NOVOLAK RESIN PREPARATION EXAMPLE 1

Into a 2 l separable flask, 237.91 g of m-cresol, 190.33 g of p-cresol, 53.7 g of 2,5-xylenol, 15 g of oxalic acid dihydrate and 1 ml of 35% hydrochloric acid were charged, the internal temperature was raised to 95° C. with stirring, and 31.8 g of 90% acetaldehyde was dropwise added thereto, followed by a reaction at that temperature for two hours. Then, 211.4 g of a 37% formalin aqueous solution was dropwise added thereto. The mixture was reacted for 5 hours while maintaining the temperature. Then, the internal temperature was raised to 180° C. over a period of 1.5 hours to conduct the reaction while distilling water off. After distilling water off, the internal temperature was further raised to 195° C., and unreacted monomers were distilled off under a reduced pressure of 20 Torr to obtain a novolak resin (a). The molecular weight of the novolak resin (a) was 3,500. The ratio of formaldehyde/acetaldehyde (charged molar ratio) was 8/2 and (A)/(D) was 5.4. Further, $(\beta)/(\alpha)$ was 0.18.

NOVOLAK RESIN PREPARATION EXAMPLE 2

Into a 2 l separable flask, 237.91 g of m-cresol, 190.33 g of p-cresol, 53.75 g of 2,5-xylenol, 15 g of oxalic acid dihydrate and 1 ml of 35% hydrochloric acid were charged, and 31.8 g of 90% acetaldehyde was dropwise added thereto under stirring at room temperature. Then, stirring was continued at room temperature for 30 minutes. Then, the internal temperature was raised to 95° C., and 205.5 g of a 37% formalin aqueous solution was dropwise added thereto. The mixture was reacted for 5 hours while maintaining the temperature. Then, the internal temperature was raised to 180° C. over a period of 1.5 hours to conduct the reaction while distilling water off. After distilling water off, the internal temperature was further raised to 195° C., and unreacted monomers were distilled off under a reduced pressure of 20 Torr to obtain a novolak resin (b). The molecular weight of the novolak resin (b) was 3,500. The ratio of formaldehyde/acetaldehyde (charged molar ratio) was 8/2 and (A)/(D) was 5.9. Further, ($\beta$)/($\alpha$) was 0.28.

NOVOLAK RESIN PREPARATION EXAMPLE 3

A novolak resin (c) was prepared in the same manner as in Novolak Resin Preparation Example 2 except that the amounts of acetaldehyde and formalin were changed to 24.6 g of 90% acetaldehyde and 201.2 g of a 37% formalin aqueous solution, respectively. The molecular weight of the novolak resin (c) was 3,000. The ratio of formaldehyde/acetaldehyde (charged molar ratio) was 8/2, and (A)/(D) was 0.3. Further, ($\beta$)/($\alpha$) was 0.28.

BALLAST RESIN PREPARATION EXAMPLE 1

Into a 1 l eggplant-type flask, 324 g of m-cresol, 30 g of oxalic acid dihydrate, 3 ml of 35% hydrochloric acid and 300 ml of ethanol were charged, and 117.5 g of 90% acetaladehyde was dropwise added thereto under stirring at room temperature. Then, the mixture was reacted under reflux for 5 hours while maintaining the oil bath temperature at a level of 100° C. After completion of the reaction, the reaction solution was diluted with 300 ml of ethanol and then dropwise added to 3 l of water to precipitate crystals. Obtained crystals were collected by filtration, washed three times with 3 l of water and then dried to obtain a ballast resin (a). The molecular weight of the ballast resin (a) was 1,058.

PHOTOSENSITIVE MATERIAL PREPARATION EXAMPLE 1

31.7 g of the ballast resin (a) and 25.8 g of 1,2-naphthoquinonediazide-5-sulfonyl chloride were dissolved in a solvent mixture comprising 160 ml of acetone and 44 ml of N-methylpyrrolidone, and 10.4 g of triethylamine was dropwise added thereto. The mixture was reacted at room temperature for two hours. Then, the reaction solution was filtrated to remove triethylamine hydrochloride. The filtrate was added to 1 l of water, and precipitated crystals were collected by filtration, washed with water and dried to obtain a photosensitive material (P-1). The esterification ratio of the photosensitive material (P-1) was 40%.

PHOTOSENSITIVE MATERIAL PREPARATION EXAMPLE 2

A photosensitive material (P-2) was prepared in the same manner as in Photosensitive Material Preparation Example 1 except that 12.1 g of 2,2',3,4,4'-pentahydroxybenzophenone and 56.4 g of 1,2-naphthoquinonediazide-5-sulfonyl chloride were dissolved in a solvent mixture comprising 200 ml of 1,4-dioxane and 50 ml of N-methylpyrrolidone, and 23.2 g of triethylamine was dropwise added thereto. The esterification ratio of the photosensitive material (P-2) was 84%.

PHOTOSENSITIVE MATERIAL PREPARATION EXAMPLE 3

31.7 g of the ballast resin (a) and 16.1 g of 1,2-naphthoquinonediazide-5-sulfonyl chloride were dissolved in a solvent mixture comprising 160 ml of acetone and 44 ml of N-methylpyrrolidone, and 6.5 g of triethylamine was dropwise added thereto. The mixture was reacted at room temperature for two hours. Then, the reaction solution was filtrated to remove triethylamine hydrochloride. The filtrate was added to 1 l of water, and precipitated crystals were collected by filtration, washed with water and dried to obtain a photosensitive material (P-3). The esterification ratio of the photosensitive material (P-3) was 25%.

PHOTOSENSITIVE RESIN COMPOSITION PREPARATION EXAMPLE 1

7.690 g of the novolak resin (a) as the alkali-soluble resin and 2.049 g of the photosensitive material (P-1) and 0.662 g of photosensitive material (P-2) were dissolved in 29.60 g of methyl 3-methoxypropionate, and the solution was filtered through a membrane filter having a pore size of 0.2 μm to obtain a photosensitive resin composition (PR-1).

PHOTOSENSITIVE RESIN COMPOSITION PREPARATION EXAMPLES 2 TO 4

Photosensitive resin compositions (PR-2) to (PR-4) were prepared in the same manner as in Photosensitive Resin Composition Preparation Example 1 except that the novolak resins and the photosensitive material as identified in Table 1 were combined in the proportions as identified in Table 1.

EXAMPLE 1 AND COMPARATIVE EXAMPLES 1 TO 3

Photosensitive resin compositions (PR-1) to (PR-4) were subjected to patterning in accordance with the patterning method 1 as described hereinafter, and the sensitivity, the resolution and the exposure margin were evaluated. The results are shown in Table 2. The following symbols and terms used in Table 2 have the following meanings respectively.

Eth: The minimum exposure required to dissolve an exposed portion of 2×2 mm completely to the substrate by an alkali developer, was represented by the exposure time.

$E_0$: The exposure whereby when the line and space patterns on a mask of 0.5 μm were 1:1, after the exposure and development with an alkali developer, the line widths of the exposed portion and the non-exposed portion were obtained at 1:1 with a size of 0.5 μm, was represented by the exposure time.

Exposure margin: The value of $E_0$/Eth (If $E_0$/Eth is less than 1, image forming tends to be impossible. As $E_0$/Eth increases, the scope of exposure useful for image forming widens.)

Resolution: The minimum line and space pattern capable of being resolved with an exposure of $E_0$.

Heat resistance: The maximum temperature at which a line and space pattern of 5 μm undergoes no deformation when a wafer is heated for 5 minutes on a hot plate (measured at intervals of 5° C.).

Patterning method 1

A photosensitive resin composition was coated on a silicon wafer by a spin coater and heated on a hot plate of 80° C. for 90 seconds to remove the solvent and to form a photoresist coating film having a thickness of 1.07 μm. This coated wafer was subjected to exposure by an i-line stepper (NA=0.5) manufactured by Nikon and then heated on a hot plate of 110° C. for 90 seconds. Then, it was developed by immersing it in a 2.38% tetramethylammonium hydroxide aqueous solution at 23° C. for 60 seconds.

TABLE 1

| | Photosensitive resin composition No. | Photosensitive material P-1/P-2 (charged weight ratio) | Novolak resin Type | Novolak resin Molecular weight | Photosensitive material/Novolak resin (charged weight ratio) |
|---|---|---|---|---|---|
| Example 1 | PR-1 | 3.10 | (a) | 3500 | 0.352 |
| Comparative Example 1 | PR-2 | 3.10 | (b) | 3500 | 0.352 |
| Comparative Example 2 | PR-3 | 3.10 | (c) | 3000 | 0.352 |
| Comparative Example 3 | PR-4 | 3.10 | (b) | 3500 | 0.298 |

TABLE 2

| | Photosensitive resin composition No. | Eth (msec) | $E_0$ (msec) | $E_0$/Eth | Resolution (μm) | Heat resistance (5 μm, °C.) |
|---|---|---|---|---|---|---|
| Example 1 | PR-1 | 119 | 210 | 1.76 | 0.36 | 130 |
| Comparative Example 1 | PR-2 | 166 | 288 | 1.73 | 0.36 | 130 |
| Comparative Example 2 | PR-3 | 134 | 231 | 1.72 | 0.40 | 125 |
| Comparative Example 3 | PR-4 | 124 | 203 | 1.64 | 0.38 | 125 |

PHOTOSENSITIVE RESIN COMPOSITION PREPARATION EXAMPLES 5 AND 6

Photosensitive resin compositions (PR-5) and (PR-6) were prepared in the same manner as in Photosensitive Resin Composition Preparation Example 1 except that the novolak resins and the photosensitive material as identified in Table 3 were combined in the proportions as identified in Table 3.

EXAMPLE 2 AND COMPARATIVE EXAMPLE 4

Photosensitive resin compositions (PR-5) and (PR-6) were subjected to patterning in accordance with the patterning method 2 as described hereinafter, and the sensitivity, the resolution and the exposure margin were evaluated. The results are shown in Table 4. The following symbols and terms used in Table 4 have the same meanings as in Table 2 respectively.

Patterning method 2

A photosensitive resin composition was coated on a silicon wafer by a spin coater and heated on a hot plate of 83° C. for 70 seconds to remove the solvent and to form a photoresist coating film having a thickness of 0.86 μm. This coated wafer was subjected to exposure by an i-line stepper (NA=0.5) manufactured by Nikon and then heated on a hot plate of 120° C. for 70 seconds. Then, it was developed by immersing it in a 2.38% tetramethylammonium hydroxide aqueous solution at 23° C. for 60 seconds.

TABLE 3

| | Photosensitive resin composition No. | Photosensitive material P-1/P-3 (charged weight ratio) | Novolak resin Type | Novolak resin Molecular weight | Photosensitive material/Novolak resin (charged weight ratio) |
|---|---|---|---|---|---|
| Example 2 | PR-5 | 2.61 | (a) | 3500 | 0.718 |
| Comparative Example 4 | PR-6 | 2.61 | (b) | 3500 | 0.718 |

TABLE 4

| | Photosensitive resin composition No. | Eth (msec) | $E_0$ (msec) | $E_0$/Eth | Resolution (μm) | Heat resistance (5 μm, °C.) |
|---|---|---|---|---|---|---|
| Example 2 | PR-5 | 205 | 440 | 2.15 | 0.34 | 130 |

TABLE 4-continued

| | | | | | | |
|---|---|---|---|---|---|---|
| Comparative Example 4 | PR-6 | 250 | 530 | 2.12 | 0.34 | 130 |

PHOTOSENSITIVE RESIN COMPOSITION PREPARATION EXAMPLES 7 AND 8

Photosensitive resin compositions (PR-7) and (PR-8) were prepared in the same manner as in Photosensitive Resin Composition Preparation Example 1 except that the novolak resins and the photosensitive material as identified in Table 5 were combined in the proportions as identified in Table 5.

EXAMPLE 3 AND COMPARATIVE EXAMPLE 5

Photosensitive resin compositions (PR-7) and (PR-8) were subjected to patterning in accordance with the patterning method 3 as described hereinafter, and the sensitivity, the resolution and the exposure margin were evaluated. The results are shown in Table 6. The following symbols and terms used in Table 6 have the same meanings as in Table 2 respectively.

Patterning method 3

A photosensitive resin composition was coated on a silicon wafer by a spin coater and heated on a hot plate of 80° C. for 90 seconds to remove the solvent and to form a photoresist coating film having a thickness of 2.0 μm. This coated wafer was subjected to exposure by an i-line stepper (NA=0.5) manufactured by Nikon and then heated on a hot plate of 110° C. for 90 seconds. Then, it was developed by immersing it in a 2.38% tetramethylammonium hydroxide aqueous solution at 23° C. for 60 seconds.

hours. Then, 247.2 g of a 37% formalin aqueous solution was dropwise added thereto. The mixture was reacted for 5 hours while maintaining the temperature. Then, the internal temperature was raised to 180° C. over a period of 1.5 hours to conduct the reaction while distilling water off. After distilling water off, the internal temperature was further raised to 195° C., and unreacted monomers were distilled off under a reduced pressure of 20 Torr to obtain a novolak resin (d). The molecular weight of the novolak resin (d) was 3,500. The ratio of formaldehyde/acetaldehyde (charged molar ratio) was 9/1 and (A)/(D) was 11.7. Further, (β)/(α) was 0.09.

PHOTOSENSITIVE RESIN COMPOSITION PREPARATION EXAMPLE 5

Photosensitive resin composition (PR-9) was prepared in the same manner as in Photosensitive Resin Composition Preparation Example 1 except that the novolak resins and the photosensitive material as identified in Table 7 were combined in the proportions as identified in Table 7.

EXAMPLE 4

Photosensitive resin composition (PR-9) was subjected to patterning in accordance with the patterning method 1 in the same manner as in Example 1, and the sensitivity, the resolution and the exposure margin were evaluated. The results are shown in Table 8.

TABLE 5

| | Photosensitive resin composition No. | Photosensitive material | Novolak resin | | Photosensitive material/Novolak resin (charged weight ratio) |
|---|---|---|---|---|---|
| | | | Type | Molecular weight | |
| Example 3 | PR-7 | P-1 | (a) | 3500 | 0.414 |
| Comparative Example 5 | PR-8 | P-1 | (b) | 3500 | 0.414 |

TABLE 6

| | Photosensitive resin composition No. | Eth (msec) | $E_0$ (msec) | $E_0$/Eth | Resolution (μm) | Heat resistance (5 μm, °C.) |
|---|---|---|---|---|---|---|
| Example 3 | PR-7 | 338 | 625 | 1.85 | 0.40 | 130 |
| Comparative Example 5 | PR-8 | 410 | 750 | 1.83 | 0.45 | 130 |

NOVOLAK RESIN PREPARATION EXAMPLE 4

Into a 2 l separable flask, 237.91 g of m-cresol, 190.33 g of p-cresol, 53.75 g of 2,5-xylenol, 15 g of oxalic acid dihydrate and 1 ml of 35% hydrochloric acid were charged, the internal temperature was raised to 95° C. with stirring, and 16.6 g of 90% acetaldehyde was dropwise added thereto, followed by a reaction at that temperature for two

TABLE 7

| Photosensitive resin composition No. | Photosensitive material P-1/P-2 (charged weight ratio) | Novolak resin Type | Novolak resin Molecular weight | Photosensitive material/Novolak resin (charged weight ratio) |
|---|---|---|---|---|
| Example 4 PR-9 | 3.06 | (d) | 3500 | 0.426 |

TABLE 8

| Photosensitive resin composition No. | Eth (msec) | $E_0$ (msec) | $E_0$/Eth | Resolution (μm) | Heat resistance (5 μm, °C.) |
|---|---|---|---|---|---|
| Example 4 PR-9 | 117 | 230 | 1.97 | 0.36 | 130 |

What is claimed is:

1. A photosensitive resin composition comprising an alkali-soluble resin, a quinonediazide photosensitive compound and a solvent, wherein the alkali-soluble resin is a polycondensation product of ① at least one phenolic compound (A) of the following formula (A) with ② formaldehyde (a) and at least one carbonyl compound (b) of the following formula (B), in which the mixing ratio of the formaldehyde (a) to the carbonyl compound (b) is within a range of from 1/99 to 99/1 in terms of the molar ratio of (a)/(b), and the alkaline soluble resin has partial structures of the following formula (C), in which the weight ratio of repeating units (β) wherein m is from 1 to 5, to repeating units (α) wherein m is 0, i.e. the weight ratio of (β)/(α), is 0.01 to 0.25:

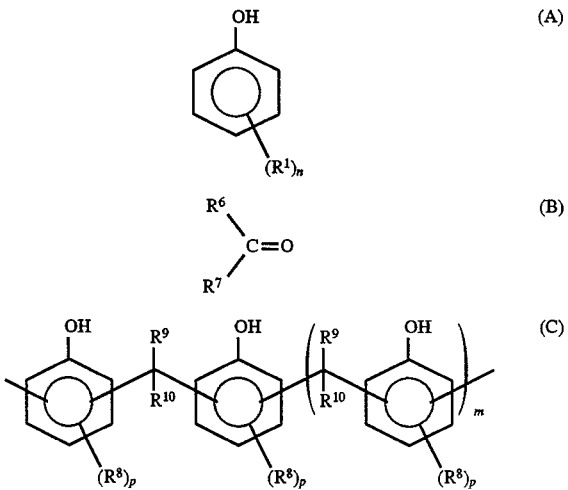

wherein $R^1$ is a group of the formula $R^2$, $OR^3$, $COOR^4$ or $CH_2COOR^5$, wherein $R^2$ is a $C_{1-4}$ alkyl group, each of $R^3$, $R^4$ and $R^5$ which are independent of one another, is a hydrogen atom or a $C_{1-4}$ alkyl group, n is an integer of from 0 to 3, provided that when n is 2 or 3, a plurality of $R^1$ may be the same or different, each of $R^6$ and $R^7$ which are independent of each other, is a hydrogen atom, a $C_{1-4}$ lower alkyl group, an aryl group or an aralkyl group, $R^8$ is the same group as $R^1$, $R^9$ is the same group as $R^6$, $R^{10}$ is the same group as $R^7$, p is the same integer as n, provided that $R^6$ and $R^7$, and $R^9$ and $R^{10}$, are not simultaneously hydrogen atoms, and m is an integer of from 0 to 5.

2. The photosensitive resin composition according to claim 1, wherein the weight ratio of the (β)/(α) is from 0.01 to 0.20.

3. The photosensitive resin composition according to claim 1, wherein in the formula (A), $R^1$ is $R^2$ or $OR^3$, wherein $R^2$ is a $C_{1-2}$ alkyl group and $R^3$ is a hydrogen atom, n is an integer of 1 or 2, and $R^8$ in the formula (C) is the same group as $R^1$.

4. The photosensitive resin composition according to claim 1, wherein in the formula (B), $R^6$ is a methyl group or an ethyl group, and $R^7$ is a hydrogen atom.

5. The photosensitive resin composition according to claim 3, wherein in the formula (C), $R^9$ is a methyl group or an ethyl group, and $R^{10}$ is a hydrogen atom.

6. The photosensitive resin composition according to claim 1, wherein the molar ratio of (a)/(b) is within a range of from 50/50 to 95/5.

7. The photosensitive resin composition according to claim 1, wherein the quinonediazide photosensitive compound is a 1,2-naphthoquinonediazide-4-sulfonate or a 1,2-naphthoquinonediazide-5-sulfonate.

8. The photosensitive resin composition according to claim 1, wherein the quinonediazide photosensitive compound is a quinonediazide sulfonate of a polyhydroxybenzophenone and/or a ballast resin.

9. A method for forming a resist pattern on a substrate for a semiconductor, which comprises coating on the substrate a photosensitive resin composition, subjecting it to exposure to copy a pattern and developing it to form the resist pattern, wherein the photosensitive resin composition comprises an alkali-soluble resin, a quinonediazide photosensitive compound and a solvent, wherein the alkali-soluble resin is a polycondensation product of ① at least one phenolic compound (A) of the following formula (A) with ② formaldehyde (a) and at least one carbonyl compound (b) of the following formula (B), in which the mixing ratio of the formaldehyde (a) to the carbonyl compound (b) is within a range of from 1/99 to 99/1 in terms of the molar ratio of (a)/(b), and the alkaline soluble resin has partial structures of the following formula (C), in which the weight ratio of repeating units (β) wherein m is from 1 to 5, to repeating units (α) wherein m is 0, i.e. the weight ratio of (β)/(α), is 0.01 to 0.25:

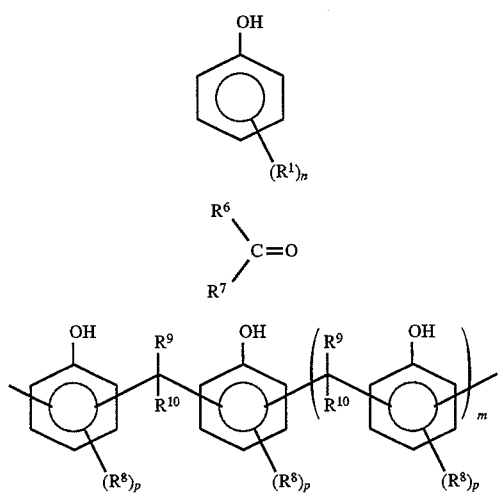

wherein $R^1$ is a group of the formula $R^2$, $OR^3$, $COOR^4$ or $CH_2COOR^5$, wherein $R^2$ is a $C_{1-4}$ alkyl group, each of $R^3$, $R^4$ and $R^5$ which are independent of one another, is a hydrogen atom or a $C_{1-4}$ alkyl group, n is an integer of from 0 to 3, provided that when n is 2 or 3, a plurality of $R^1$ may be the same or different, each of $R^6$ and $R^7$ which are independent of each other, is a hydrogen atom, a $C_{1-4}$ lower alkyl group, an aryl group or an aralkyl group, $R^8$ is the same group as $R^1$, $R^9$ is the same group as $R^6$, $R^{10}$ is the same group as $R^7$, p is the same integer as n, provided that $R^6$ and $R^7$, and $R^9$ and $R^{10}$, are not simultaneously hydrogen atoms, and m is an integer of from 0 to 5.

10. A photosensitive resin composition comprising an alkali-soluble resin, a quinonediazide photosensitive compound and a solvent, wherein the alkali-soluble resin is a polycondensation product of ① at least one phenolic compound (A) of the following formula (A) and ② a mixture (D) of phenolic compounds of the following formula (D), in which the weight ratio of compounds (D-2) wherein r is from 1 to 5, to compounds (D-1) wherein r is 0, i.e. the weight ratio of (D-2)/(D-1), is 0.01 to 0.25, with formaldehyde (a):

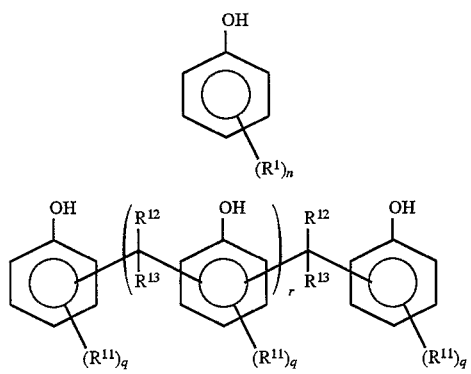

wherein $R^1$ is a group of the formula $R^2$, $OR^3$, $COOR^4$ or $CH_2COOR^5$, wherein $R^2$ is a $C_{1-4}$ alkyl group, each of $R^3$, $R^4$ and $R^5$ which are independent of one another, is a hydrogen atom or a $C_{1-4}$ alkyl group, n is an integer of from 0 to 3, provided that when n is 2 or 3, a plurality of $R^1$ may be the same or different, $R^{11}$ is the same group as $R^1$, each of $R^{12}$ and $R^{13}$ which are independent of each other, is a hydrogen atom, a $C_{1-4}$ lower alkyl group, an aryl group or an aralkyl group, q is the same integer as n, provided that $R^{12}$ and $R^{13}$ are not simultaneously hydrogen atoms, and r is an integer of from 0 to 5.

11. The photosensitive resin composition according to claim 10, wherein the weight ratio of (D-2)/(D-1) is from 0.01 to 0.20.

12. The photosensitive resin composition according to claim 10, wherein in the formula (A), $R^1$ is $R^2$ or $OR^3$, wherein $R^2$ is a $C_{1-2}$ alkyl group and $R^3$ is a hydrogen atom, n is an integer of 1 or 2, and $R^{11}$ in the formula (D) is the same as $R^1$.

13. The photosensitive resin composition according to claim 12, wherein in the formula (D), $R^{12}$ is a methyl group or an ethyl group, and $R^{13}$ is a hydrogen atom.

14. The photosensitive resin composition according to claim 10, wherein the quinonediazide photosensitive compound is a 1,2-naphthoquinonediazide-4-sulfonate or a 1,2-naphthoquinonediazide-5-sulfonate.

15. The photosensitive resin composition according to claim 10, wherein the quinonediazide photosensitive compound is a quinonediazide sulfonate of a polyhydroxybenzophenone and/or a ballast resin.

16. The photosensitive resin composition according to claim 1, wherein the concentration of the alkali-soluble resin is from 1 to 35% by weight, the concentration of the quinonediazide photosensitive compound is from 0.1 to 30% by weight and the proportion of the quinonediazide photosensitive compound relative to the alkali-soluble resin is from 0.1 to 1.5 time by weight.

17. A method for forming a resist pattern on a substrate for a semiconductor, which comprises coating on the substrate a photosensitive resin composition, subjecting it to exposure to copy a pattern and developing it to form the resist pattern, wherein the photosensitive resin composition comprises an alkali-soluble resin, a quinonediazide photosensitive compound and a solvent, wherein the alkali-soluble resin is a polycondensation product of ① at least one phenolic compound (A) of the following formula (A) and ② a mixture (D) of phenolic compounds of the following formula (D), in which the weight ratio of compounds (D-2) wherein r is from 1 to 5, to compounds (D-1) wherein r is 0, i.e. the weight ratio of (D-2)/(D-1), is 0.01 to 0.25, with formaldehyde (a):

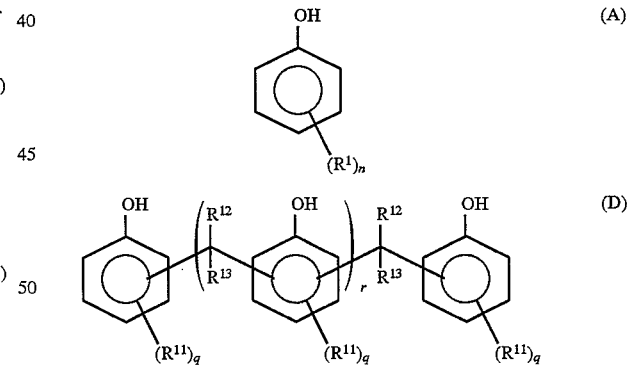

wherein $R^1$ is a group of the formula $R^2$, $OR^3$, $COOR^4$ or $CH_2COOR^5$, wherein $R^2$ is a $C_{1-4}$ alkyl group, each of $R^3$, $R^4$ and $R^5$ which are independent of one another, is a hydrogen atom or a $C_{1-4}$ alkyl group, n is an integer of from 0 to 3, provided that when n is 2 or 3, a plurality of $R^1$ may be the same or different, $R^{11}$ is the same group as $R^1$, each of $R^{12}$ and $R^{13}$ which are independent of each other, is a hydrogen atom, a $C_{1-4}$ lower alkyl group, an aryl group or an aralkyl group, q is the same integer as n, provided that $R^{12}$ and $R^{13}$ are not simultaneously hydrogen atoms, and r is an integer of from 0 to 5.

* * * * *